United States Patent
Miyata (10) Patent No.: US 6,503,830 B2
(45) Date of Patent: Jan. 7, 2003

(54) METHOD OF MANUFACTURING A SEMICONDUCTOR DEVICE

(75) Inventor: Koji Miyata, Mie (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/897,472

(22) Filed: Jul. 3, 2001

(65) Prior Publication Data

US 2002/0025670 A1 Feb. 28, 2002

(30) Foreign Application Priority Data

Jul. 4, 2000 (JP) ........................................ 2000-201742

(51) Int. Cl.[7] .......................................... H01L 21/4763
(52) U.S. Cl. ...................... 438/637; 438/624; 438/627; 438/634; 438/638
(58) Field of Search ................................ 438/637, 638, 438/624, 627, 634

(56) References Cited

U.S. PATENT DOCUMENTS

| | | | | |
|---|---|---|---|---|
| 5,663,101 A | * | 9/1997 | Cronin | 438/637 |
| 5,869,395 A | * | 2/1999 | Yim | 438/637 |
| 6,048,787 A | * | 4/2000 | Lee | 438/624 |
| 6,083,822 A | * | 7/2000 | Lee | 438/624 |
| 6,140,226 A | * | 10/2000 | Grill et al. | 438/637 |
| 6,174,803 B1 | * | 1/2001 | Harvey | 438/638 |

* cited by examiner

Primary Examiner—Jey Tsai
Assistant Examiner—Lynne A. Gurley
(74) Attorney, Agent, or Firm—Rader, Fishman & Grauer PLLC; Ronald P. Kananen, Esq.

(57) ABSTRACT

In a method of manufacturing a semiconductor device, an enlargement phenomenon of a wiring groove pattern is suppressed which is produced when a wiring groove and a connection hole are formed with the aid of hard masks of two layers and when the wiring groove pattern is formed by etching in the lower layer hard mask with the aid of the upper layer hard mask, wiring groove working with high accuracy and high reliability is realized, and short circuit failure of groove wiring lines is eliminated. In the method of manufacturing the semiconductor device in which the connection hole is formed in a first insulating film while mask layers of plural layers are used, and the wiring groove is formed in a second insulating film, the mask layers of the plural layers are formed in such a manner that a first mask layer is formed of the same material as the first insulating film on the second insulating film, and after a second mask layer is formed thereon, a wiring groove pattern is formed in the second mask layer, and further, after a third mask layer is formed of the same material as the first mask layer thereon, a connection hole pattern is formed to extend through the third mask layer and the first mask layer.

7 Claims, 3 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device, and particularly to a method of manufacturing a semiconductor device, which includes a forming method of a dual damascene structure using a so-called dual hard mask.

2. Description of the Related Art

In the wiring structure of the dual damascene structure, a silicon oxide layer is used as a connection layer in which a connection hole is formed, an organic film is used as a wiring layer in which groove wiring lines are formed, a silicon oxide film is used as a lower layer hard mask, and a silicon nitride film is used as an upper layer hard mask.

Hereinafter, a method of manufacturing groove wiring lines using a conventional dual hard mask method will be described with reference to manufacturing process sectional views of FIGS. 3A to 3G.

Figure 3A:
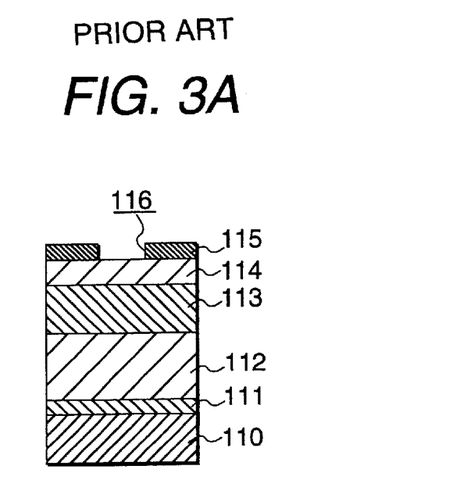
FIGS. 3A to 3G are manufacturing process sectional views showing a conventional technique.

Although not shown, for example, after a semiconductor element, a wiring line and the like are formed on a semiconductor substrate by a well-known semiconductor process technique, an interlayer insulating film covering the semiconductor element, the wiring line and the like is formed. Next, for example, a silicon nitride film for preventing diffusion of copper is formed on the interlayer insulating film, and further, an insulating film in which a groove wiring line is formed, is formed of, for example, a silicon oxide film.

Next, by using a normal forming technique of a groove wiring line, a groove for formation of a wiring line is formed in the silicon oxide film. Then, a barrier layer for preventing diffusion of copper is formed on the inner surface of the groove, and further, after copper is embedded in the inside of the groove through the barrier layer, the surplus copper and barrier layer on the silicon oxide film are removed, and a first wiring line is formed in the inside of the groove. In this way, a base body 110 as shown in FIG. 3A is formed.

Thereafter, for example, by a PE-CVD (Plasma Enhancement) (Chemical Vapor Deposition) method, a barrier layer 111 made of a silicon nitride film for preventing diffusion of copper is formed to a thickness of, for example, 50 nm on the base body 110. Next, for example, by the PE-CVD method, a first insulating film 112, which becomes a connection layer in which a connection hole is formed, is formed on the barrier layer 111 by forming, for example, a silicon oxide film of a thickness of 500 nm.

Next, for example, by the PE-CVD method, an organic film of a thickness of, for example, 400 nm is formed on the first insulating film 112 so that a second insulating film 113 is formed.

Next, by a chemical vapor deposition (hereinafter referred to as CVD) method or a physical vapor deposition (hereinafter referred to as PVD) method, a lower layer hard mask 114 is formed on the second insulating film 113 by forming, for example, a silicon oxide film of a thickness of 200 nm. Further, an upper layer hard mask 115 of, for example, a silicon nitride film of a thickness of 100 nm is formed on the lower layer hard mask 114.

Figure 3B:
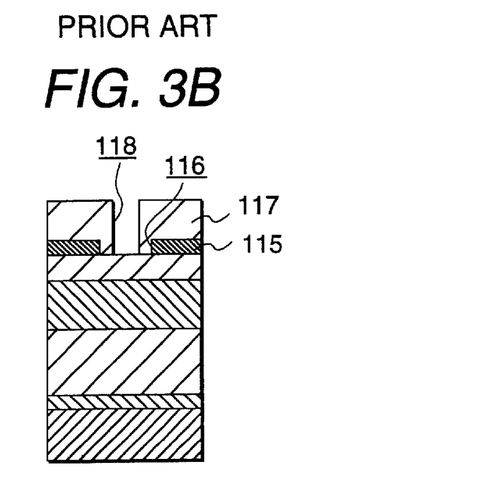

Next, although not shown, after a resist mask (not shown) which becomes an etching mask for formation of a groove is formed by resist coating and a lithography technique, the upper layer hard mask 115 is subjected to, for example, anisotropic etching by an etching technique using the resist mask, so that an opening 116 for formation of a wiring groove is formed. Thereafter, the resist mask is removed by a normal resist removal technique Next, as shown in FIG. 3B, a resist mask 117 is formed on the hard mask 115 including the inside of the opening 116 by the resist coating technique. Then, an opening 118 for formation of a connection hole is formed in the resist film 117 by the lithography technique.

As an example of the etching conditions of the upper layer hard mask 115 made of the silicon nitride film, for example, a magnetron etching apparatus was used, trifluoromethane ($CHF_3$) (supply flow rate was, for example, 20 $cm^3$/min), argon (Ar) (supply flow rate was, for example, 200 $cm^3$/min) and oxygen ($O_2$) (supply flow rate was, for example, 10 $cm^3$/min) were used as etching gases, the pressure of an etching atmosphere was set to 10 Pa, and the substrate temperature was set to 0° C.

Figure 3C:
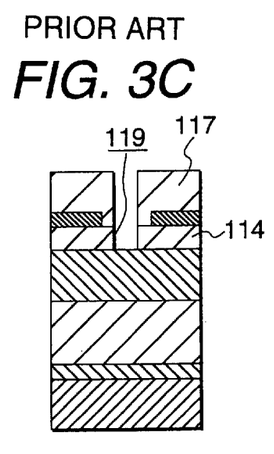

Next, as shown in FIG. 3C, the resist film 117 is used as a mask, and the lower hard mask 114 is subjected to, for example, anisotropic etching by an etching technique to form a connection hole pattern 119.

As an example of the etching conditions of the lower layer hard mask 114 made of the silicon oxide film, for example, a magnetron etching apparatus was used, octafluorocyclobutane ($C_4F_8$) (supply flow rate was, for example, 20 $cm^3$/min), argon (Ar) (supply flow rate was, for example, 200 $cm^3$/min) and oxygen ($O_2$) (supply flow rate was, for example, 10 $cm^3$/min) were used as etching gases, the pressure of an etching atmosphere was set to 10 Pa, and the substrate temperature was set to 0° C.

Figure 3D:
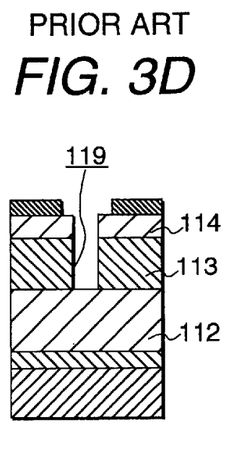

Further, as shown in FIG. 3D, the etching is made to proceed while the lower layer hard mask 114 is used as a mask, and the connection hole pattern 119 is formed to extend into the second insulating film 113 made of the organic film. In this etching, since the organic film is etched while the lower mask 114 made of the silicon oxide film is used as the etching mask, the first insulating film 112 made of the silicon oxide film functions as an etching stopper. Besides, in this etching, since the resist mask 117 (see FIG. 3C) is also etched and is removed, an etching process for removing only the resist mask 117 is not required.

As an example of the etching conditions of the organic film, for example, an electron cyclotron resonance (hereinafter referred to as ECR) etching apparatus was used, ammonia ($NH_3$) (supply flow rate was, for example, 100 $cm^3$/min) was used as an etching gas, and the pressure of an etching atmosphere was set to 3 Pa.

Figure 3E:
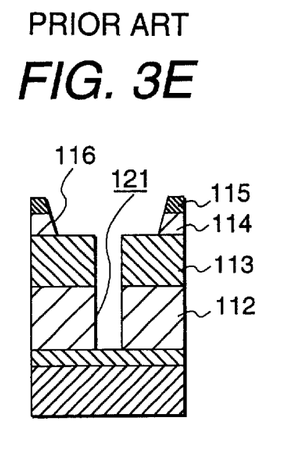

Next, as shown in FIG. 3E, the wiring groove pattern 116 is formed to extend into the lower hard mask 114 while the upper layer hard mask 115 is used as the etching mask, and a connection hole 121 is formed in the first insulating film 112 while the second insulating film 113 is used as an etching mask. In this etching, over etching for etching the silicon oxide film of a thickness of 500 nm is applied to the upper layer hard mask 115. Thus, the wiring groove pattern 116 moves back.

Figure 3F:
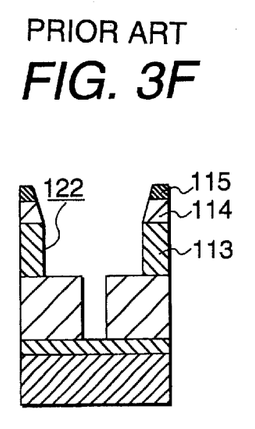

Next, as shown in FIG. 3F, the upper layer hard mask 115 and the lower layer hard mask 114 are used as etching masks, and a wiring groove 122 is formed in the second insulating film 113.

Figure 3G:
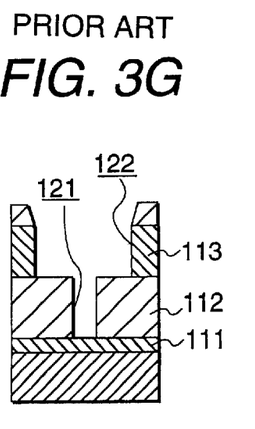

Further, as shown in FIG. 3G, the first insulating film 112 is used as an etching mask, and the barrier layer 111 made of the silicon nitride film exposed at the bottom of the connection hole 121 is removed by etching. At this time, the upper layer hard mask 115 (see FIG. 3F) is also removed at the same time. As an example of the etching conditions of the silicon nitride film, for example, a magnetron etching apparatus was used, trifluoromethane ($CHF_3$) (supply flow rate was, for example, 20 cm$^3$/min), argon (Ar) (supply flow rate was, for example, 200 cm$^3$/min) and oxygen ($O_2$) (supply flow rate was, for example, 10 cm$^3$/min) were used as etching gases, the pressure of an etching atmosphere was set to 10 Pa, and the substrate temperature was set to 0° C.

In this way, the wiring groove 122 is formed in the second insulating film 113, and the connection hole 121 communicating with the first wiring line (not shown) is formed in the first insulating film 112.

However, in the conventional technique, since etching selectivity to the upper layer hard mask is insufficient, when the wiring groove pattern is formed in the lower layer hard mask while the upper layer hard mask is used as the etching mask, there arises a problem that the wiring groove pattern is formed to be enlarged when the wiring groove pattern formed in the mask is enlarged, the wiring groove formed in the second insulating film is formed to be larger than a design size, so that short circuit failure occurs when a conductive material is embedded in the wiring groove to form a wiring line.

In order to prevent the enlargement of the wiring groove, it is effective to thicken the upper layer hard mask. However, when the upper layer hard mask is thickened, there arises a problem at the photolithography step for forming the connection hole pattern in the lower layer hard mask. In general, in the photolithography step including a stepped portion, an anti-reflection film of a thickness of about 50 nm to 100 nm is formed as an under layer of a photosensitive resist. By forming the anti-reflection film, light beams irradiated at the time of exposure are prevented from being reflected by the under layer, and the resolution is improved. However if there is a stepped portion at the time of formation of the anti-reflection film, since the film formation of the anti-reflection film can not be uniformly carried out, there arises a problem that the resolution at the photolithography step is lowered. Especially, in the case where the under layer stepped portion exceeds 100 nm, it becomes difficult to form the anti-reflection film in an excellent state.

For example, the minimum resolution diameter at the photolithography step of forming an opening for formation of a connection hole pattern is 0.22 μm for a stepped portion of a height of 100 nm. Besides, it is 0.25 μm for a stepped portion of a height of 200 nm. Like this, as the stepped portion becomes lower, the resolution at the photolithography step becomes higher. Especially, it is important to make the height of the stepped portion 100 nm or less. Accordingly, it has been difficult to form the upper layer hard mask to be thicker than 100 nm.

Incidentally, although there is an electron beam direct drawing as an exposure method which does not receive an influence of reflection by an under stepped portion, that is, which does not use the antireflection film, since this exposure method raises costs, it is not a technique for mass production at present.

SUMMARY OF THE INVENTION

The present invention has been made to solve the above problems and provides a method of manufacturing a semiconductor device.

According to the present invention, a method of manufacturing a semiconductor device comprises a step of forming, in a laminated manner, a first insulating film in which a connection hole is formed and a second insulating film in which a wiring groove communicating with the connection hole is formed, a step of forming mask layers of plural layers on the second insulating film, and a step of forming the connection hole in the first insulating film and forming the wiring groove in the second insulating film while the mask layers of the plural layers are used; and the step of forming the mask layers of the plural layers includes a step of forming a first mask layer, in which a connection hole pattern is formed, of a same material as the first insulating film on the second insulating film, a step of forming a wiring groove pattern in a second mask layer after the second mask layer is formed on the first mask layer, a step of forming a third mask layer of a same material as the first mask layer on the second mask layer including an inner portion of the wiring groove pattern, and a step of forming the connection hole pattern extending through the third mask layer and the first mask layer.

Since the method of manufacturing the semiconductor device comprises the step of forming the third mask layer on the second mask layer including the inner portion of the wiring groove pattern, when the connection hole is formed in the first insulating film by carrying out etching of a silicon oxide film, the third mask layer is etched at the initial stage of the etching, and there occurs such a state that the second mask layer is protected by the third mask layer. When the third mask layer is removed by etching of the silicon oxide film and the second mask layer is exposed, thereafter, the second mask layer becomes an etching mask and the wiring groove pattern is formed to extend into the first mask layer, and further, the second insulating film becomes an etching mask and the connection hole is formed to pass through the first insulating film.

Like this, in the etching for formation of the connection hole, since the third mask layer has been formed, the whole load of the etching for the formation of the connection hole and the formation of the wiring groove pattern is not applied to the second mask layer. That is, at the initial stage of the etching, the etching is applied to the third mask layer, and after the third mask layer is removed by the etching, the second mask layer becomes the etching mask, so that even if over etching is carried out, the second mask layer is not excessively etched.

Further, since the third mask layer is formed of the same material as the first mask layer, as the first mask layer is etched, the third mask layer is also etched, and is removed when the connection hole is formed in the first insulating film. Thus, it is not necessary to provide a step of removing the third mask layer.

Besides, since the third mask layer is formed, it is not necessary to form the second mask layer to be thick, so that the thickness of the second mask layer can be made 100 nm or less. Therefore, a stepped portion on the surface of the third mask layer formed on the second mask layer also can be made 100 nm or less. Thus, lowering of the resolution by the stepped portion at the lithography step of forming the connection hole pattern is suppressed.

Besides, since the method of the invention comprises the step of forming the first mask layer, in which the connection hole pattern is formed, of the same material as the first insulating film on the second insulating film, when the second insulating film is etched while the first mask layer is used as the etching mask, the first insulating film functions as an etching stopper.

DETAILED DESCRIPTION OF THE PREFERRED EMBODIMENTS

A method of manufacturing a semiconductor device according to a first embodiment of the present invention will be described with reference to the manufacturing process sectional views of FIGS. 1A to 1H.

Figure 1A:
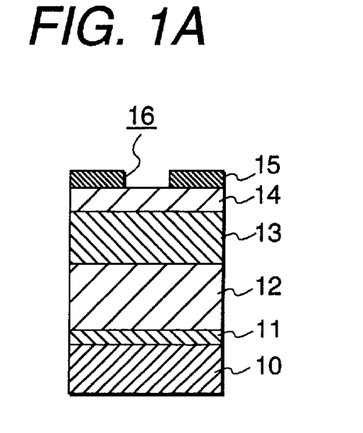
FIGS. 1A to 1H are manufacturing process sectional views showing a method of manufacturing a semiconductor device according to a first embodiment of the present invention.

Although not shown, for example, after a semiconductor element, a wiring line and the like are formed on a semiconductor substrate by a well-known semiconductor process technique, an interlayer insulating film covering the semiconductor element, the wiring line and the like is formed. Next, for example, a silicon nitride film for preventing diffusion of copper is formed on the interlayer insulating film, and further, an insulating film in which a groove wiring line is formed, is formed of, for example, a silicon oxide film. Next, by using a normal forming technique of a groove wiring line, a groove for formation of a wiring line is formed in the silicon oxide film. A barrier layer for preventing diffusion of copper is formed on the inner surface of the groove, and further, after copper is embedded in the inside of the groove through the barrier layer, the surplus copper and barrier layer on the silicon oxide film are removed, so that a first wiring line is formed in the inside of the groove. In this way, a base body 10 shown in FIG. 1A is formed.

Thereafter, for example, by the PE-CVD method, a barrier layer made of a silicon nitride film for preventing diffusion of copper is formed to a thickness of, for example, 50 nm on the base body. Next, for example, by the PE-CVD method; a first insulating film 12, which becomes a connection layer in which a connection hole is formed, is formed on the barrier layer 11 by forming, for example, a silicon oxide film of a thickness of 500 nm. This first insulating film 12 becomes an insulating film (ILD: Inter Level Dielectrics) between wiring layers, for keeping the insulation between the first wiring line (not shown), which becomes a lower layer wiring line, and a second wiring line to be formed later, which becomes an upper-layer wiring line.

Next, for example, by the PE-CVD method, an organic film of a thickness of, for example, 400 nm is formed on the first insulating film 12 to form a second insulating film 13. This second insulating film 13 becomes an insulating film (IMD: Inter Metal Dielectrics) between wiring lines, for keeping the insulation between the second wiring lines to be formed later which become the upper layer wiring lines.

Subsequently, by the chemical vapor deposition method or the physical vapor deposition method, a lower layer hard mask 14 is formed of a silicon oxide film of a thickness of, for example, 200 nm on the second insulating film 13. Further, an upper layer hard mask 15 is formed of a silicon nitride film of a thickness of, for example, 100 nm on the lower layer hard mask 14.

Next, although not shown, after a resist mask (not shown) which becomes an etching mask for formation of a groove is formed by resist coating and a lithography technique, the second mask layer 15 is subjected to, for example, anisotropic etching by an etching technique using the resist mask, so that a wiring groove pattern 16 for formation of a wiring groove is formed. Thereafter, the resist mask is removed by a normal resist removing technique.

As an example of the etching conditions of the first mask layer 15, a magnetron etching apparatus was used, trifluoromethane ($CHF_3$) (supply flow rate was, for example, 20 $cm^3$/min), argon (Ar) (supply flow rate was, for example, 200 $cm^3$/min) and oxygen ($O_2$) (supply flow rate was, for example, 10 $cm^3$/min) were used as etching gases, the pressure of an etching atmosphere was set to 10 Pa, and the substrate temperature was set to 0° C.

Figure 1B:
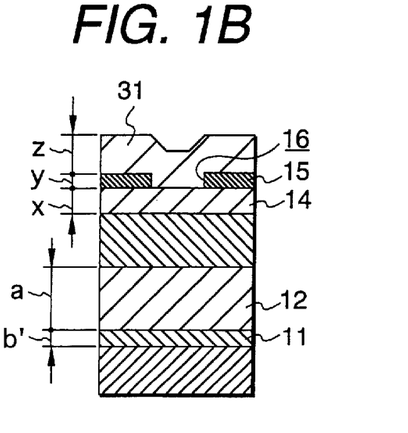

Next, as shown in FIG. 1B, a third mask layer 31 of a thickness of, for example, 300 nm is formed by a film forming technique on the second mask 15 including the inner portion of the wiring groove pattern 16. The third mask layer 31 can be formed by using a high density plasma CVD apparatus. In the film formation by the high density plasma CVD apparatus, since a film can be formed while a stepped portion is smoothed, the resolution in a subsequent resist exposure process is improved.

The third mask layer 31 maybe formed by using, for example, a parallel flat plate plasma CVD apparatus, in addition to the film formation by the high density plasma CVD apparatus, or may be formed by using a coater (for example, a rotation coater) and by, for example, SOG (Spin on glass).

Besides, the film thickness z of the third mask layer 31 is made not less than the film thickness y of the second mask layer 15 and not higher than a value obtained by subtracting the film thickness x of the first mask layer 14 from the sum of the film thickness a of the first insulating film 12 and the film thickness b of the barrier layer 11, which becomes an etching stopper layer formed under the first insulating film 12, in terms of an etching amount of silicon oxide film.

In the first embodiment, since the second mask layer 15 is formed to a thickness of y=100 nm, the film thickness lower limit value of the third mask layer 31 becomes z≧100 nm. On the other hand, the film thickness a of the first insulating film 12 is 500 nm. Since the barrier layer 11 is formed of the silicon nitride film of a thickness b'=50 nm, if an etching selection ratio of the silicon oxide film to the silicon nitride film is made 10, the film thickness b of the barrier layer 11 in terms of the etching amount of the silicon oxide film becomes 500 nm. Accordingly, the sum of the film thickness a of the first insulating film 12 and the film thickness b of the barrier layer 11 in terms of the etching amount of the silicon oxide film becomes 1000 nm, and when the film thickness y=200 nm of the first mask layer 14 is subtracted from the sum, the film thickness upper limit value of the third mask layer 15 becomes z≦800 nm.

Thus, it is necessary that the third mask layer 31 is formed to the film thickness z of from 100 nm to 800 nm. Desirably, it is preferable that the third mask layer 31 is formed to a thickness of a value (for example, 300 nm) obtained by subtracting the film thickness x of the first mask layer 14 from the film thickness a of the first insulating film 12.

Figure 1C:
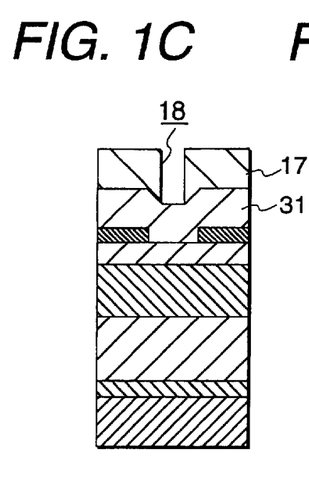

Next, as shown in FIG. 1C, a resist film 17 is formed on the third mask layer 31 by a resist coating technique. Then, an opening 18 for formation of a connection hole is formed in the resist film 17 by a lithography technique. Incidentally, it is preferable that an anti-reflection film (not shown) is formed on the surface of the third mask layer 31 before the resist film 17 is formed. By forming the anti-reflection film of an organic material, when the resist film 17 is removed in a subsequent step, the anti-reflection film is also removed together with the resist film 17. In the case where the anti-reflection film is formed of a material other than the organic material, after the resist film 17 is removed, the anti-reflection film may be selectively removed by, for example, etching or the like.

Figure 1D:
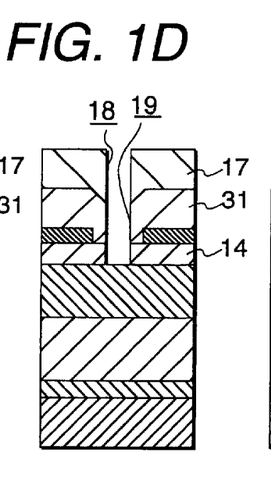

Next, as shown in FIG. 1D, the resist film 17 is used as a mask, and by an etching technique, the third mask layer 31 and the first mask layer 14 made of silicon oxide films are subjected to anisotropic etching to form a connection hole pattern 19 that is formed by extending the opening 18.

As an example of the etching conditions of the third mask layer 31 and the first mask layer 14 made of the silicon oxide films, a magnetron etching apparatus was used, octafluorocyclobutane ($C_4F_8$) (supply flow rate was, for example, 20 cm$^3$/min), argon (Ar) (supply flow rate was, for example, 200 cm$^3$/min) and oxygen ($O_2$) (supply flow rate was, for example, 10 cm/min) were used as etching gases, and the substrate temperature was set to 0° C.

Figure 1E:
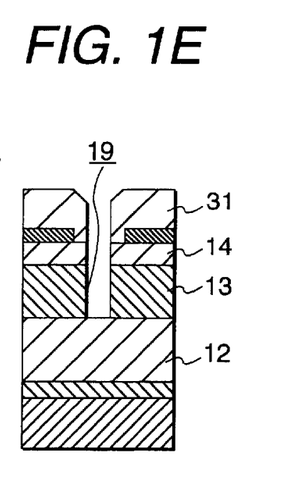

Further, as shown in FIG. 1E, the third mask layer 31 and the first mask layer 14 are used as masks to advance the etching, so that the connection hole pattern 19 is formed to extend into the second insulating film 13 made of the organic film. In this etching, since the second insulating film 13 made of the organic film is etched while the third mask layer 31 and the first mask layer 14 made of the silicon oxide films are used as the etching masks, the first insulating film 12 made of the silicon oxide film functions as an etching stopper. Besides, in this etching, since the resist film 17 (see FIG. 1D) is also etched and removed, an etching process for removing only the resist film 17 is not required.

As an example of the etching conditions of the organic films (the second insulating film 13 and the resist film 17), an ECR etching apparatus was used, ammonia ($NH_3$) (supply flow rate was, for example, 100 cm$^3$/min) was used as an etching gas, and the pressure of the etching atmosphere was set to 3 Pa.

Figure 1F:
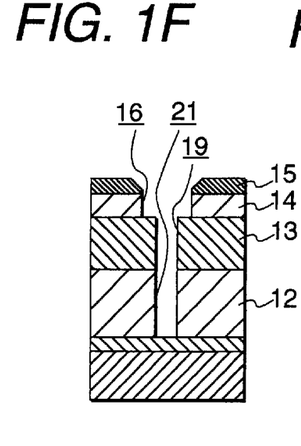

Next, as shown in FIG. 1F, etching of silicon oxide films is carried out. By this etching, the first insulating film 12 formed of the silicon oxide film at the bottom of the connection hole pattern 19 is etched, and a connection hole 21 is formed in the first insulating film 12. Besides, since the third mask layer 31 (see FIG. 1E) is also formed of the silicon oxide film, the third mask layer 31 is also etched by this etching. Since the third mask layer 31 is formed to be thinner than the first insulating film 12, before the connection hole 21 is formed to pass through the first insulating film 12, the third mask 31 is etched and removed, and the second mask layer 15 is exposed Thereafter, the wiring groove pattern 16 is formed to extend into the first mask layer 14 while the second mask layer 15 is used as an etching mask, and the connection hole 21 is formed to pass through the first insulating film 12 while the second insulating film 13 is used as an etching mask.

In the etching, since the third mask layer 31 has been formed, the whole etching for the formation of the connection hole 21 and the re-creation of the wiring groove pattern 16 is not applied to the second mask layer 15. That is, at the initial stage of the etching, the etching is applied to the third mask layer 31, and after the third mask layer 31 is etched and removed, the second mask layer 15 becomes the etching mask, so that the second mask layer 15 is not excessively etched. That is, in this etching, only the over-etching for etching the silicon oxide film of a thickness of 200 nm is applied to the second mask layer 15. Thus, even if the so-called counter-boring of the second mask layer 15 occurs at the peripheral portion of the wiring groove pattern 16, there does not occur a case where the wiring groove pattern 16 moves back and the wiring groove pattern 16 is enlarged.

Figure 1G:
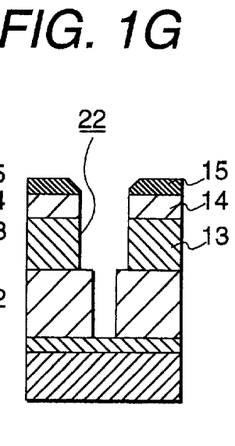

Further, as shown in FIG. 1G, the second mask layer 15 and the first mask layer 14 made of the silicon oxide film are used as etching masks, and a wiring groove 22 is formed in the second insulating film 13.

Figure 1H:
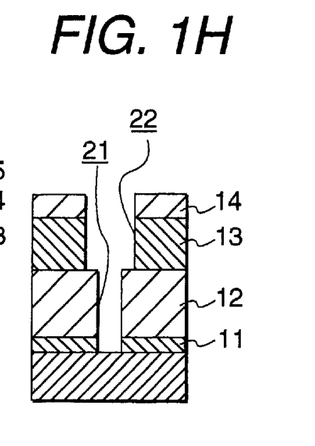

Further, as shown in FIG. 1H, the first insulating film 12 is used as an etching mask, and the barrier layer 11 made of the silicon nitride film exposed at the bottom of the connection hole 21 is removed by etching. At this time, the second mask layer 15 (see FIG. 1G) made of the silicon nitride film is also removed. At that time, the first mask layer 14 becomes an etching stopper. As an example of the etching conditions of the silicon nitride film, for example, a magnetron etching apparatus was used, trifluoromethane ($CHF_3$) (supply flow rate was, for example, 20 cm$^3$/min), argon (Ar) (supply flow rate was, for example, 200 cm$^3$/min) and oxygen ($O_2$) (supply flow rate was, for example, 10 cm$^3$/min) were used as etching gases, the pressure of an etching atmosphere was set to 10 Pa, and the substrate temperature was set to 0° C.

In this way, the wiring groove 22 is formed in the second insulating film 13, and the connection hole 21 communicating with the first wiring line (not shown) is formed in the first insulating film 12.

In the method of manufacturing the semiconductor device described in the first embodiment, since the third mask layer 31 is formed on the second mask layer 15 including the inner portion of the wiring groove pattern 16, when the connection hole 21 is formed in the first insulating film 12 by etching the silicon oxide film, the third mask layer 31 is etched at the initial stage of the etching, and there occurs a state that the second mask layer 15 is protected by the third mask layer 31.

When the third mask layer 31 is removed by the etching of the silicon oxide film and the second mask layer 15 is exposed, thereafter, the wiring groove pattern 16 is formed to extend into the first mask layer 14 while the second mask layer 15 becomes the etching mask, and the connection hole 21 is formed to pass through the first insulating film 12 while the second insulating film 13 becomes the etching mask.

Like this, in the etching for the formation of the connection hole 21, since the third mask layer 31 has been formed, the whole load of the etching for the formation of the connection hole 21 and the formation of the wiring groove pattern 16 is not applied to the mask layer 15. That is, the etching is applied to the third mask layer 31 at the initial stage of the etching, and after the third mask layer 31 is etched and removed, the second mask layer 15 becomes the etching mask, so that even if over-etching is carried out, the second mask layer 15 is not excessively etched.

Further, since the third mask layer 31 is formed of the same material as the first mask layer 14, as the first mask layer 14 is etched, the third mask layer 31 is also etched, and is removed at the point when the connection hole 21 is formed in the first insulating film 12. Thus, it is not necessary to provide a step of removing the third mask layer 31.

Besides, since it is not necessary to form the second mask layer 15 to be thick, the film thickness y of the second mask layer 15 can be made 100 nm or less. By that, the stepped portion of the surface of the third mask layer 31 formed on the second mask layer 14 can also be made 100 nm or less. Thus, the lowering of the resolution by the stepped portion at the lithography step of forming the connection hole pattern 19 can be suppressed.

Besides, since the first mask layer 14, in which the connection hole pattern 19 is formed, on the second insulating film 13 is made of the same material as the first insulating film 12, when the second insulating film 13 is etched while the first mask layer 14 is used as the etching mask, the first insulating film 12 functions as the etching stopper.

Next, the film. thickness of the third mask layer 31 will be described in detail.

The third mask layer 31 is formed to be thicker than the film thickness y of the second mask layer 15, as described above. By this, it becomes possible to form the third mask layer 31 on the second mask layer 15 in such a state that the third mask layer sufficiently covers the second mask layer 15.

Besides, the film thickness z of the third mask layer 15 is made not higher than the value obtained by subtracting the film thickness x of the first mask layer 13 from the sum of the film thickness a of the first insulating film 12 and the film thickness b of the barrier layer 11, which becomes the etching stopper layer formed under the first insulating film 12, in terms of the etching amount of the silicon oxide film. Thus, at the etching for the formation of the connection hole 21, it becomes possible to expose the second mask layer 15 by etching and removing the third mask layer 31. Besides, in the etching for the formation of the connection hole, even if over-etching is carried out to remove the third mask layer 31, there does not occur a case in which the connection hole 21 is formed to pass through the barrier layer (etching stopper layer) 11, which is the under layer of the first insulating film 12.

In the first embodiment, since the second mask layer 15 is formed to a thickness of y=100 nm, the film thickness lower limit value of the third mask layer 31 becomes z≧100 nm. In case the third mask layer 31 is formed to be thinner than the film thickness y (for example, 100 nm) of the second mask layer 15, the covering property to the second mask layer 15, especially the covering property at the stepped portion, becomes insufficient, which causes the second mask layer 15 to move back at the time of etching for the formation of the connection hole so that the wiring groove pattern 16 is enlarged.

On the other hand, the film thickness a of the first insulating film 12 is 500 nm. Since the barrier layer 11 is formed of the silicon nitride film of a thickness of 50 nm, if the etching selection ratio of the silicon oxide film to the silicon nitride film is made 10, the film thickness b of the barrier layer 11 in terms of the etching amount of the silicon oxide film becomes 500 nm. Accordingly, the sum of the film thickness a of the first insulating film 12 and the film thickness b of the barrier layer 11 in terms of the etching amount of the silicon oxide film becomes 1000 nm, and when the film thickness x=200 nm of the first mask layer 14 is subtracted from the sum, the film thickness upper limit value of the third mask layer 15 becomes z≦800 nm. if the film thickness z of the third mask layer 31 is made thicker than the value (for example 800 nm) obtained by subtracting the film thickness x of the first mask layer 14 from the sum of the film thickness a of the first insulating film 12 and the film thickness b of the barrier layer 11 in terms of the etching amount of the silicon oxide film, even if the connection hole 21 is formed to pass through the barrier layer 11, the third mask layer 31 remains on the second mask layer 15, so that it becomes difficult to form the wiring groove pattern 16 to extend into the first mask layer 14 while the second mask layer 15 is used.

Thus, it is necessary that the third mask layer 31 is formed to a thickness of from 100 nm to 800 nm. Desirably, it is preferable that the third mask layer 31 is formed to a thickness of the value (for example, 300 nm) obtained by subtracting the film thickness x of the first mask layer 14 from the film thickness a of the first insulating film 12.

Next, a method of manufacturing a semiconductor device according to a second embodiment of the present invention will be described with reference to the manufacturing process sectional views of FIGS. 2A to 2I. In FIGS. 2A to 2I, the same structural parts as those explained in FIGS. 1A to 1H are designated by the same characters.

Figure 2A:
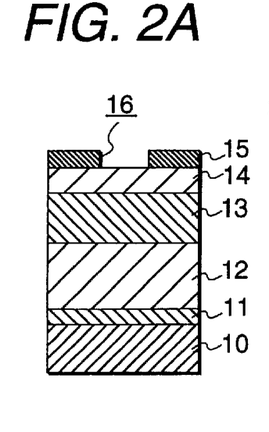
FIGS. 2A to 2I are manufacturing process sectional views showing a method of manufacturing a semiconductor device according to a second embodiment of the present invention.

Although not shown, for example, after a semiconductor element, a wiring line and the like are formed on a semiconductor substrate by a well-known semiconductor process technique, an interlayer insulating film covering the semiconductor element, the wiring line and the like is formed. Next, for example a silicon nitride film for preventing diffusion of copper is formed on the interlayer insulating film, and further, an insulating film in which a groove wiring line is formed, is formed of, for example, a silicon oxide film. Next, by using a normal forming technique of a groove wiring line, a groove for formation of a wiring line is formed in the silicon oxide film. A barrier layer for preventing diffusion of copper is formed on the inner surface of the groove, and further, after copper is embedded in the inside of the groove through the barrier layer, the surplus copper and barrier layer on the silicon oxide film are removed, so that a first wiring line is formed in the inside of the groove. In this way, a base body 10 shown in FIG. 2A is formed.

Thereafter, for example, by the PE-CVD method, a barrier layer 1 made of a silicon nitride film for preventing diffusion of copper is formed to a thickness of, for example, 50 nm on the base body 10. Next, for example, by the PE-CVD method, a first insulating film 12, which becomes a connection layer in which a connection hole is formed, is formed on the barrier layer 11 by forming, for example, a silicon oxide film of a thickness of 500 nm. This first insulating film 12 becomes an insulating film (ILD: Inter Level Dielectrics) between wiring layers for keeping the insulation between the first wiring line (not shown), which becomes a lower layer wiring line, and a second wiring line to be formed later, which becomes an upper layer wiring line.

Next, for example, by the PE-CVD method, an organic film of a thickness of, for example, 400 nm is formed on the first insulating film 12 so that a second insulating film 13 is formed. This second insulating film 13 becomes an insulating film (IMD: Inter Metal Dielectrics) between wiring lines, for keeping the insulation between the second wiring lines to be formed later, which become the upper layer wiring lines.

Next, by a chemical vapor deposition method or a physical vapor deposition method, a hard mask layer (lower layer hard mask) 14 is formed on the second insulating film 13 by forming, for example, a silicon oxide film of a thickness of 200 nm. Further, a second mask layer (upper layer hard mask) 15 of, for example, a silicon nitride film of a thickness of 100 nm is formed on the first mask layer 14.

Next, although not shown, after a resist mask (not shown) which becomes an etching mask for formation of a groove is formed by resist coating and a lithography technique, the second mask layer 15 is subjected to, for example, anisotropic etching by an etching technique using the resist mask, so that a wiring groove pattern 16 for formation of a wiring groove is formed. Thereafter, the resist mask is removed by a normal resist removing technique.

As an example of the etching conditions of the first mask layer 15, for example, a magnetron etching apparatus was used, trifluoromethane ($CHF_3$) (supply flow rate was, for example, 20 cm$^3$/min), argon (Ar) (supply flow rate was, for example, 200 cm$^3$/min) and oxygen ($O_2$) (supply flow rate was, for example, 10 cm$^3$/min) were used as etching gases, the pressure of an etching atmosphere was set to 10 Pa, and the substrate temperature was set to 0° C.

Figure 2B:
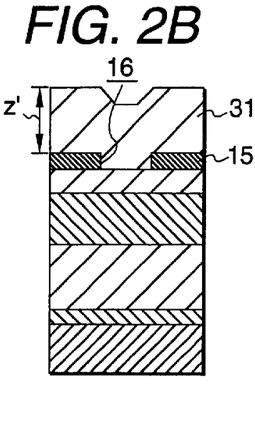

Next, as shown in FIG. 2B, a third mask layer 31 is formed to a thickness of, for example, 500 nm on the second mask layer 15 including the inner portion of the wiring groove pattern 16 by a film formation technique.

Figure 2C:
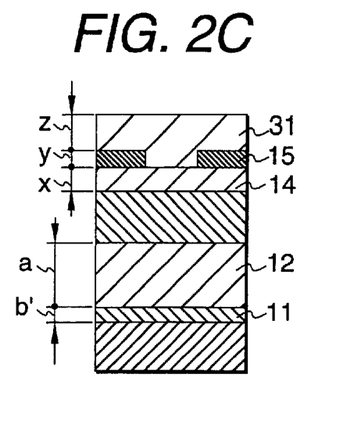

Next, as shown in FIG. 2C, the surface of the third mask layer 31 is flattened by, for example, chemical mechanical polishing. Here, the surface of the third mask layer 31 was polished until the film thickness z of the third mask layer 31 became, for example, 300 nm. The film thickness z of the third mask layer 31 after the polishing is made not less than the film thickness y of the second mask layer 15 and not higher than a value obtained by subtracting the film thickness x of the first mask layer 14 from the sum of the film thickness a of the first insulating film 12 and the film thickness b of the barrier layer 11, which becomes an etching stopper layer formed under the first insulating film 12, in terms of an etching amount of a silicon-oxide film. Besides, it is necessary that the film thickness z' of the third mask layer 31 before the polishing is made a film thickness obtained by adding a thickness (for example, (surface stepped portion+50 nm) to (surface stepped portion+200 nm)) not less than the stepped portion on the surface of the third mask layer 31 to the set thickness after the polishing since the surface is flattened by the polishing. In this embodiment, the surface stepped portion (=100 nm)+100 nm is added to the set thickness (=300 nm) after the polishing, and the third mask layer 31 is formed to a thickness of 500 nm as described above.

In the second embodiment, since the second mask layer 15 is formed to a thickness of y=100 nm, the film thickness lower limit value of the third mask layer 31 after polishing becomes z≧100 nm. On the other hand, the film thickness a of the first insulating film 12 is 500 nm. Besides, since the barrier layer 11 is formed of the silicon-nitride film of a thickness of b'=50 nm, it the etching selection ratio of the silicon-oxide film to the silicon-nitride film is 10, the thickness b of the barrier layer 11 in terms of the etching amount of the silicon-oxide film becomes 500 nm. Accordingly, the sum of the thickness a of the first insulating film 12 and the thickness b of the barrier layer 11 in terms of the etching amount of the silicon-oxide film becomes 1000 nm, and when the film thickness y=200 nm of the first mask layer 24 is subtracted from the sum, the film thickness upper limit value of the third mask layer 15 after the polishing becomes z≦800 nm.

Thus, it is necessary that the mask layer 31 after the polishing is formed to have the film thickness z of from 100 nm to 800 nm. Desirably, it is preferable that the third mask layer 31 is formed to a thickness of a value (for example, 300 nm) obtained by subtracting the film thickness x of the first mask layer 14 from the film thickness a of the first insulating film 12.

Figure 2D:
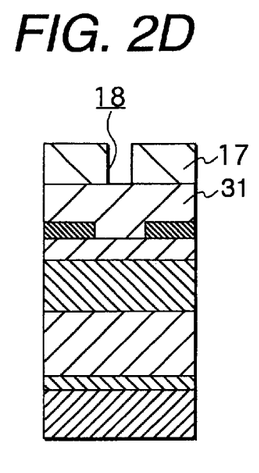

Next, as shown in FIG. 2D, a resist film 17 is formed on the third mask layer 31 by a resist coating technique Then, by a lithography technique, an opening 18 for the formation of a connection hole is formed in the resist film 17. Incidentally, it is preferable that an anti-reflection film (not shown) is formed on the surface of the third mask layer 31 before the resist film 17 is formed. By forming the anti-reflection film of an organic material, when the resist film 17 is removed in a subsequent step, the anti-reflection film also is removed together with the resist film 17. In the case where the anti-reflection film is formed of a material other than the organic material, after the resist film 17 is removed, the anti-reflection film may be selectively removed by, for example, etching or the like.

Figure 2E:
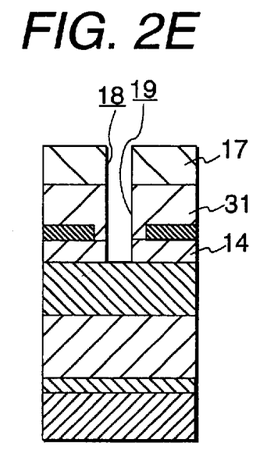

Next, as shown in FIG. 2E, the resist film 17 is used as a mask, and the third mask layer 31 and the first mask layer 14 made of the silicon-oxide films are subjected to, for example, anisotropic etching by an etching technique to form a connection hole pattern 19 that is formed by extending the opening 18.

As an example of the etching conditions of the third mask layer 31 and the first mask layer 14 made of the silicon oxide films, a magnetron etching apparatus was used, octafluorocyclobutane ($C_4F_8$) (supply flowrate was, for example, 20 cm$^3$/min), argon (Ar) (supply flow rate was, for example, 200 cm$^3$/min) and oxygen ($O_2$) (supply flow rate was, for example, 10 cm$^3$/min) were used as etching gases, the pressure of the etching atmosphere was set to 10 Pa, and the substrate temperature was set to 0° C.

Figure 2F:
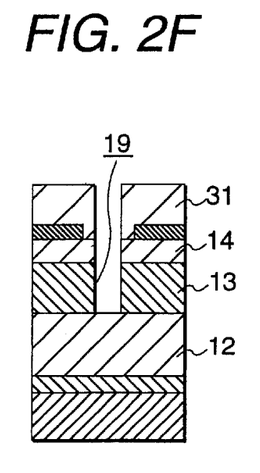

Further, as shown in FIG. 2F, the third mask layer 31 and the first mask layer 14 are used as masks to advance the etching, so that the connection hole pattern 19 is formed to extend into the second insulating film 13 made of the organic film. in this etching, since the second insulating film 13 is etched while the third mask layer 31 and the first mask layer 14 made of the silicon-oxide films are used as the etching masks, the first insulating film 12 made of the silicon-oxide film functions as an etching stopper. Besides, in this etching, since the resist film 17 (see FIG. 2E) also is etched and is removed, an etching process for removing only the resist film 17 is not required.

As an example of the etching conditions of the organic films (the second insulating film 13 and the resist film 17), for example, an ECR etching apparatus was used, ammonia ($NH_3$) (supply flow rate was, for example, 100 cm$^3$/min) was used as the etching gas, the pressure of an etching atmosphere was set to 3 Pa, and the substrate temperature was set to −20° C.

Figure 2G:
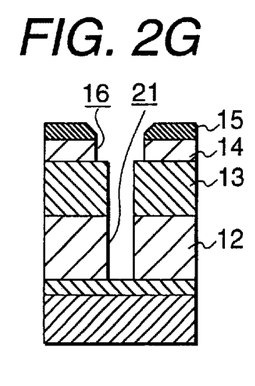

Next, as shown in FIG. 2G, the wiring groove pattern 16 is formed to extend into the first mask layer 14 while the second mask layer 15 is used as an etching mask, and a connection hole 21 is formed in the first insulating film 12 while the second insulating film 13 is used as an etching mask. In this etching, since the third mask layer 31 (see FIG. 2F) has been formed, the whole etching for the formation of the connection hole 21 and the formation of the wiring groove pattern is not applied to the second mask layer 15. That is, the etching is applied to the third mask layer 31 at the initial stage of the etching, and after the third mask layer 31 is etched and removed, the second mask layer 15 becomes an etching mask, so that the second mask layer 15 is not excessively etched. That is, in this etching, only the over-etching for etching the silicon oxide film of a thickness of 200 nm is applied to the second mask layer 15. Thus, even if the so-called counter-boring of the second mask layer 15 occurs at the peripheral portion of the wiring groove pattern 16, there does not occur a case that the wiring groove pattern 16 moves back and the wiring groove pattern 16 is enlarged.

Figure 2H:
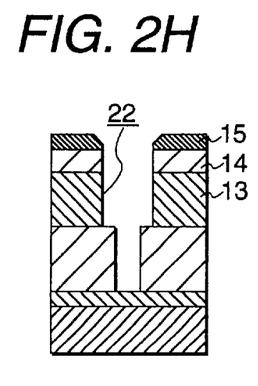

Further, as shown in FIG. 2H, the second mask layer 15 and the first mask layer 14 made of the silicon-oxide films are used as the etching masks, and a wiring groove 22 is formed in the second insulating film 13.

Figure 2I:
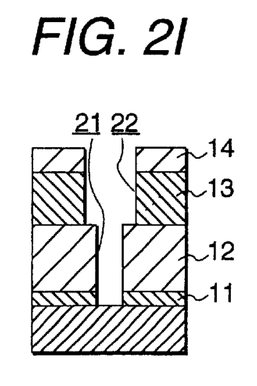

Further, as shown in FIG. 2I, the first insulating film 12 is used as an etching mask, and the barrier layer 11 made of the silicon nitride film exposed at the bottom of the connection hole 21 is removed by etching. At this time, the second mask layer 15 (see FIG. 2H) made of the silicon nitride film is also removed at the same time. As an example of the etching conditions of the silicon nitride film, for example, a magnetron etching apparatus was used, trifluoromethane ($CHF_3$) (supply flow rate was, for example, 20 cm$^3$/min), argon (Ar) (supply flow rate was, for example, 200 cm$^3$/min) and oxygen ($O_2$) (supply flow rate was, for example, 10 cm$^3$/min) were used as etching gases, the pressure of an etching atmosphere was set to 10 Pa, and the substrate temperature was set to 0° C.

In this way, the wiring groove 22 is formed in the second insulating film 13, and the connection hole 21 communicating with the first wiring line (not shown) is formed in the first insulating film 12.

In the second embodiment, after the third mask layer 31 is formed, the surface is flattened, so that it becomes possible to improve the patterning accuracy of the resist process for forming the connection hole pattern 19 to be formed in the third mask layer 31. That is, it becomes possible to improve the patterning accuracy (exposure accuracy) of the opening portion 18 formed in the resist film 17.

Besides, in the case where an anti-reflection film is formed, since the anti-reflection film can be formed on the flat surface, the anti-reflection film can be formed to have a uniform thickness, and the resolution at exposure can be raised Thus, a high accuracy working becomes possible, and the position accuracy of the connection hole to the wiring groove can be raised. Also, it becomes possible to further raise the wiring reliability.

Besides, by using a krypton fluorine, excimer-laser exposure apparatus instead of an argon-fluorine, excimer-laser exposure apparatus, it becomes possible to manufacture a semiconductor device having the same components per chip by a less expensive technique.

The respective structural parts in the second embodiment have the same functions as those explained in the first embodiment. Besides, the film thickness of the third mask layer 31 after the surface of the third mask layer 31 is flattened is the same as that explained in the first embodiment.

Next, although not shown, a description will be given of an example in which a groove wiring line and a plug are formed in the respective inner portions of the wiring groove 22 and the connection hole 21 formed in the respective embodiments.

A barrier layer for preventing diffusion of copper is formed of, for example, a tungsten-nitride film on the respective inner surfaces of the wiring groove 22 and the connection hole 21 by a chemical vapor deposition method. As an example of the film formation conditions of the tungsten-nitride film, a gas mixture (supply flow rate is, for example, 0.25 ml/min) of tungsten hexafluoride ($WF_6$), nitrogen ($N_2$) and hydrogen ($H_2$) is used, the pressure of a film formation atmosphere is set to 3 Pa, and the film formation temperature is set to 350° C.

Next, copper is deposited on the respective inner surfaces of the wiring groove 22 and the connection hole 21 through the barrier layer to form a plating seed layer by a film forming method in which conformal film formation is enabled, such as a chemical vapor deposition method or an electroless plating method. The film thickness of the plating seed layer is made a thickness such that the plating seed layer is not completely dissolved at electrolytic plating carried out at a subsequent step, and the thickness is made, for example, about 10 nm to 50 nm.

In order to form the plating seed layer by electroless plating, first, metal having catalytic capacity is deposited on the surface to be plated, so that a catalysis activation treatment is carried out. Specifically, for example, a catalysting treatment is carried out in which the surface to be plated is exposed to a solution (the temperature is, for example, 15° C. to 60° C.) of palladium chloride (for example, 0.1 g/L to 0.5 g/L), stannous chloride (for example, 1 g/L to 25 g/L), and hydrochloric acid (for example, 100 mL/L to 300 mL/L) for 2 minutes to 5 minutes, and thereafter, an accelerator treatment is carried out in which the surface to be plated is immersed in hydrochloric acid (for example, 100 mL/L) for 1 minute to 3 minutes to remove stannous chloride and to deposit palladium as the metal having the catalytic capacity on the surface to be plated.

Next, the plating seed layer made of copper is deposited by the electroless plating method on the surface of the barrier layer which becomes the surface to be plated. As an example of the electroless plating conditions, a plating solution made of copper chloride (II) ($CuCl_2$) (for example, 0.05 mol/L), cobalt nitrate ($Co(No_3)_2$) (for example, 0.15 mol/L), ethylene diamine (for example, 0.6 mol/L), ascorbic acid (for example, 0.01 mol/L), and a surfactant and the like is used, the temperature of the plating solution is set to, for example, 50° C., the pH of the plating solution is set to, for example, 6.75, and the plating time is set to, for example, 2 minutes so that the thickness becomes 30 nm.

Besides, the plating seed layer also can be formed by the chemical vapor deposition method of copper As an example of the film formation conditions in this case, hexafluoro acetylacetonate copper.trimethyl.vinylsilane [(hfac)Cu (TVS)] is used as a raw material gas, the supply flow rate is set to, for example, 0.25 cm$^3$/min, and the film formation temperature is set to 150° C. to 300° C.

Next, for example, by the electrolytic plating method of copper, the respective inner portions of the wiring groove 22 and the connection hole 21 are filled with metal plating layers made of copper. At that time, the metal plating layer also is deposited on the insulating film through the barrier layer and the plating seed layer. As an example of the electrolytic plating conditions in the case where the metal plating layer is formed, a copper sulfate based copper electrolytic plating solution is used as the plating solution, the plating temperature is set to 18° C., the plating current value is set to 2.83 A, and the plating time is set to 4 minutes and 30 seconds, so that copper is deposited to a thickness of 1.0 μm.

Thereafter, surplus wiring formation layers (surplus metal plating layer, plating seed layer, barrier layer, etc.) on the insulating film are removed by, for example, chemical mechanical polishing. As an example of the chemical-mechanical polishing conditions, a laminate structure of a non-woven fabric and a closed cell foam is used for a polishing pad, an alumina-containing slurry added with hydrogen peroxide is used as polishing slurry, the supply flow rate of the slurry is set to 100 cm$^3$/min, the temperature of the slurry is set to 25° C. to 30° C., the polishing pressure is set to 98 Pa, the number of revolutions of a polishing plate is set to 30 rpm, and the number of revolutions of a polishing head set to 30 rpm. Incidentally, the barrier layer (tungsten nitride film) is etched and removed by hydrogen peroxide contained in the polishing solution. As a result, the plug is formed of the wiring formation layer in the connection hole 21 through the barrier layer, and the groove wiring line connected to the plug is formed of the wiring formation layer in the upper wiring groove 22.

In the above embodiments, the first insulating film 12 is formed of the silicon-oxide film, the second insulating film 13 is formed of the organic insulating film, the first mask layer 14 is formed of the silicon-oxide film, and the second mask layer 15 is formed of the silicon-nitride film. As the silicon-oxide film, it is possible to use non-doped silicate glass (USG), phosphorus silicate glass (PSG), or boron phosphorus silicate glass (BPSG), which has a relative dielectric constant of about 4.0, fluorine silicate glass (FSG) having a relative dielectric constant of about 3.5, or the like. As the organic insulating film, for example, polyarylether having a relative dielectric constant of about 2.7 is used. Since the organic insulating film has dielectric constant lower than the silicon-oxide film, the parasitic capacitance of the wiring lines is decreased, and a signal delay can be reduced. Thus, the application to a high performance semiconductor device has been reviewed. Incidentally, the formation materials of the first insulating film 12 and the second insulating film 13 are not limited to the above exemplified materials and constitution as long as the process by the dual hard mask method can be realized in the materials and constitution.

As described above, according to the method of manufacturing the semiconductor device of the present invention, since the third mask layer is formed on the second mask layer including the inner portion of the wiring groove pattern, the whole load of etching for the formation of the connection hole and the wiring groove pattern is not applied to the second mask layer, and the connection hole and the wiring groove pattern can be formed. That is, the etching is applied to the third mask layer at the initial stage of the etching, and after the third mask layer is etched and removed, the second mask layer becomes the etching mask, so that even if over-etching is carried out, the second mask layer is not excessively etched. Thus, since the wiring groove pattern can be formed in the first mask layer while the wiring groove pattern formed in the second mask layer is not enlarged, it becomes possible to form the wiring groove as designed in the second insulating film. Thus, it is possible to form the wiring groove and the connection hole with high reliability and high accuracy.

What is claimed is:

1. A method of manufacturing a semiconductor device, comprising:

a step of forming, in a laminated manner, a first insulating film in which a connection hole is formed and a second insulating film in which a wiring groove communicating with the connection hole is formed;

a step of forming mask layers of plural layers on the second insulating film; and a step of forming the connection hole in the first insulating film and forming the wiring groove in the second insulating film while the mask layers of the plural layers are used, wherein the step of forming the mask layers of the plural layers includes:

a step of forming a first mask layer, in which a connection hole pattern is formed, of a same material as the first insulating film on the second insulating film;

a step of forming a wiring groove pattern in a second mask layer after the second mask layer is formed on the first mask layer;

a step of forming a third mask layer of a same material as the first mask layer on the second mask layer including an inner portion of the wiring groove pattern; and a step of forming the connection hole pattern extending through the third mask layer and the first mask layer.

2. A method of manufacturing a semiconductor device according to claim 1, wherein the step of forming the connection hole in the first insulating film and forming the wiring groove in the second insulating film while the mask layers of the plural layers formed on the second insulating film are used includes:

a step of forming the connection hole pattern to extend into the second insulating film while the third mask layer and the first mask layer are used as etching masks;

a step of forming the wiring groove pattern to extend into the first mask layer while the second mask layer is used as an etching mask after the wiring groove pattern is re-created in the second mask layer by etching the third mask layer and the first mask layer, and forming the connection hole in the first insulating film while the second insulating film is used as an etching mask; and a step of forming the wiring groove in the second insulating film while the second mask layer is used as an etching mask.

3. A method of manufacturing a semiconductor device according to claim 1, wherein a film thickness of the third mask layer is made not less than a film thickness of the second mask layer and not higher than a value obtained by subtracting a film thickness of the first mask layer from a sum of a film thickness of the first insulating film and a film thickness of an etching stopper layer, which is formed under the first insulating film, in terms of an etching amount of a silicon oxide film.

4. A method of manufacturing a semiconductor device according to claim 1, further comprising a step of flattening a surface of the third mask layer after the third mask layer is formed.

5. A method of manufacturing a semiconductor device according to claim 4, wherein after the surface of the third mask layer is flattened, when the step of forming the connection hole pattern extending through the third mask layer and the first mask layer is carried out, an antireflection film is formed on the surface of the third mask layer.

6. A method of manufacturing a semiconductor device according to claim 4, wherein the step of forming the connection hole in the first insulating film and forming the wiring groove in the second insulating film while the mask layers of the plural layers formed on the second insulating film are used includes:

a step of forming the connection hole pattern to extend into the second insulating film while the third mask layer and the first mask layer are used as etching masks;

a step of forming the wiring groove pattern to extend into the first mask layer while the second mask layer is used as an etching mask after the wiring groove pattern is re-created in the second mask layer by etching the third mask layer and the first mask layer, and forming the connection hole in the first insulating film while the second insulating film is used as an etching mask; and a step of forming the wiring groove in the second insulating film while the second mask layer is used as an etching mask.

7. A method of manufacturing a semiconductor device according to claim 4, wherein a film thickness of the third mask layer after the step of flattening the surface of the third mask layer is carried out is made not less than a film thickness of the second mask layer and not higher than a value obtained by subtracting a film thickness of the first mask layer from a sum of a film thickness of the first insulating film and a film thickness of an etching stopper layer, which is formed under the first insulating film, in terms of an etching amount of a silicon oxide film.

* * * * *